United States Patent
Sutardja

(10) Patent No.: US 7,304,545 B1
(45) Date of Patent: Dec. 4, 2007

(54) HIGH LATENCY TIMING CIRCUIT

(75) Inventor: Pantas Sutardja, San Jose, CA (US)

(73) Assignee: Marvell International Ltd., Hamilton (BB)

( * ) Notice: Subject to any disclaimer, the term of this patent is extended or adjusted under 35 U.S.C. 154(b) by 0 days.

(21) Appl. No.: 11/507,916

(22) Filed: Aug. 22, 2006

Related U.S. Application Data

(63) Continuation of application No. 11/349,565, filed on Feb. 8, 2006, now abandoned, which is a continuation of application No. 10/831,100, filed on Apr. 26, 2004, now Pat. No. 7,049,896, which is a continuation of application No. 09/725,818, filed on Nov. 30, 2000, now Pat. No. 6,732,286.

(51) Int. Cl.
*H03L 7/00* (2006.01)

(52) U.S. Cl. .................. 331/10; 331/1 A; 331/17; 331/16; 327/156; 360/46; 360/51; 375/376; 713/400

(58) Field of Classification Search .......... 331/1 A, 331/10, 16, 17; 360/46, 51; 713/400; 375/376; 327/156

See application file for complete search history.

(56) References Cited

U.S. PATENT DOCUMENTS

| | | | |
|---|---|---|---|
| 4,712,223 A | 12/1987 | Nelson | 377/43 |
| 5,093,847 A | 3/1992 | Cheng | 375/97 |
| 5,150,082 A | 9/1992 | Grimmett et al. | 332/128 |
| 5,436,937 A | 7/1995 | Brown et al. | 375/376 |
| 5,546,433 A | 8/1996 | Tran et al. | 375/376 |
| 5,703,539 A | 12/1997 | Gillig et al. | 331/16 |
| 5,727,038 A | 3/1998 | May et al. | 375/376 |
| 5,745,011 A | 4/1998 | Scott | 331/44 |
| 5,754,607 A | 5/1998 | Powell et al. | 375/373 |
| 5,761,258 A | 6/1998 | Lee | 375/376 |
| 5,793,824 A | 8/1998 | Burch et al. | 375/372 |
| 5,874,863 A | 2/1999 | Wojewoda et al. | 331/17 |
| 5,889,829 A | 3/1999 | Chiao et al. | 375/376 |
| 5,889,863 A | 3/1999 | Weber | 705/76 |
| 5,986,513 A | 11/1999 | Nepple et al. | 331/17 |
| 5,987,085 A | 11/1999 | Anderson | 375/374 |
| 6,028,727 A | 2/2000 | Vishakhadatta et al. | 360/51 |
| 6,066,988 A | 5/2000 | Igura | 331/18 |
| 6,084,480 A | 7/2000 | Uneme | 331/17 |
| 6,111,710 A * | 8/2000 | Feyh et al. | 360/46 |
| 6,134,276 A | 10/2000 | Aman et al. | 375/326 |
| 6,650,719 B1 | 11/2003 | Baker | 375/371 |
| 6,816,328 B2 | 11/2004 | Rae | 360/51 |

* cited by examiner

*Primary Examiner*—Arnold Kinkead

(57) ABSTRACT

A phase locked loop (PLL) circuit, comprises a frequency integrator circuit that receives a target signal, a phase shift signal and a frequency gain correction parameter and that selectively disables tracking frequency offset based on a value of the frequency gain correction parameter. A phase integrator circuit communicates with frequency integrator circuit, that synchronizes phase with the target signal and generates a phase signal. A phase shift measurement circuit generates the phase shift signal based on the phase signal. A phase interpolator circuit generates the frequency gain correction parameter based on the phase signal.

25 Claims, 4 Drawing Sheets

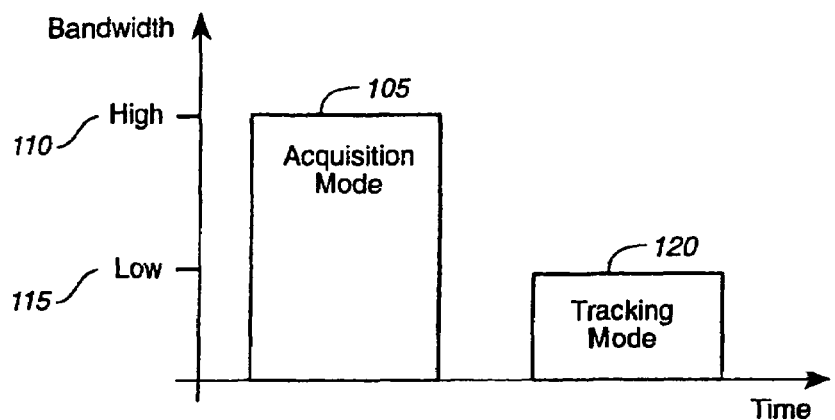
FIG._1
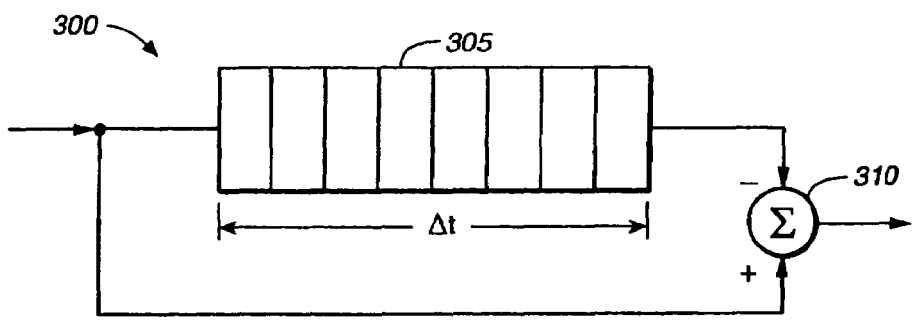
FIG._3
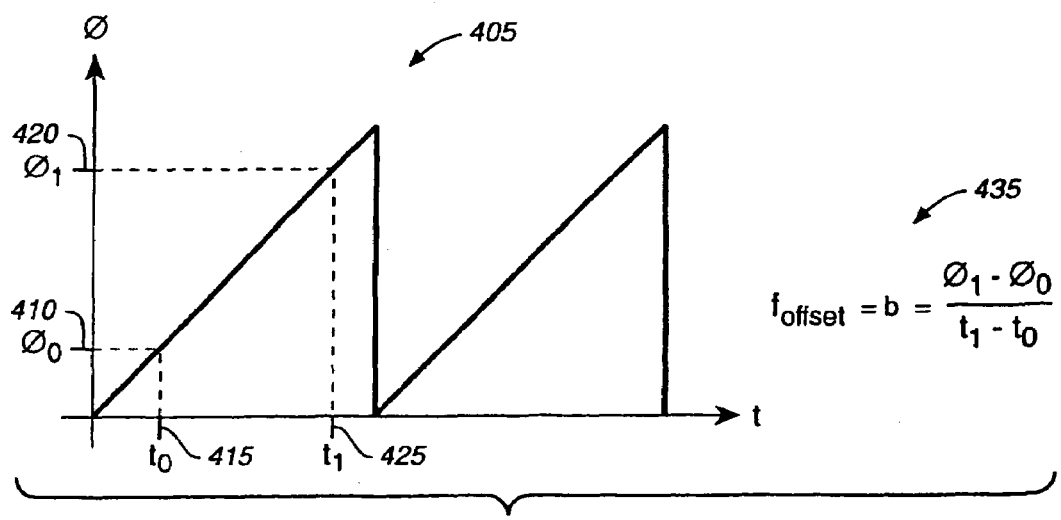
FIG._4

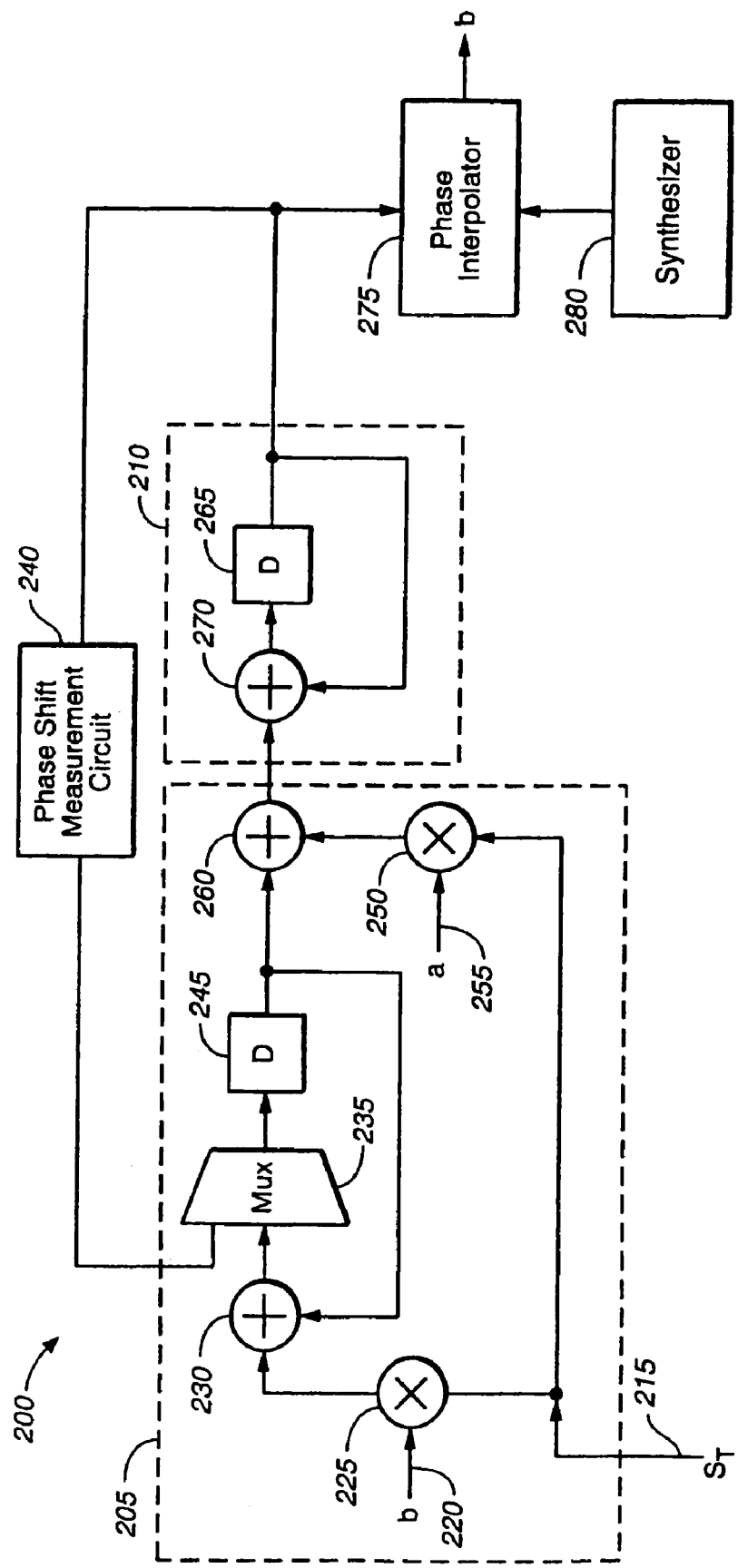
FIG._2

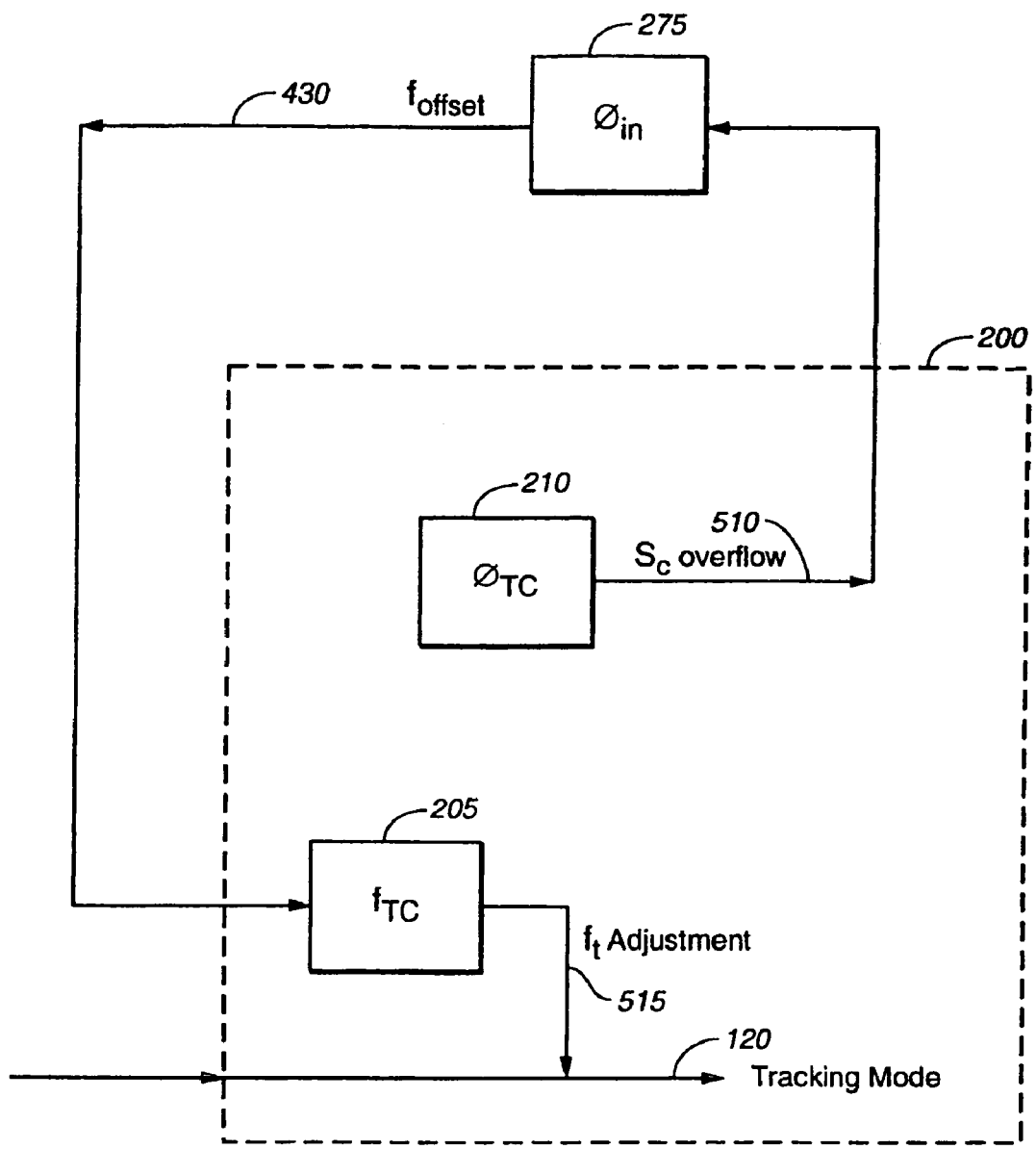
FIG._5

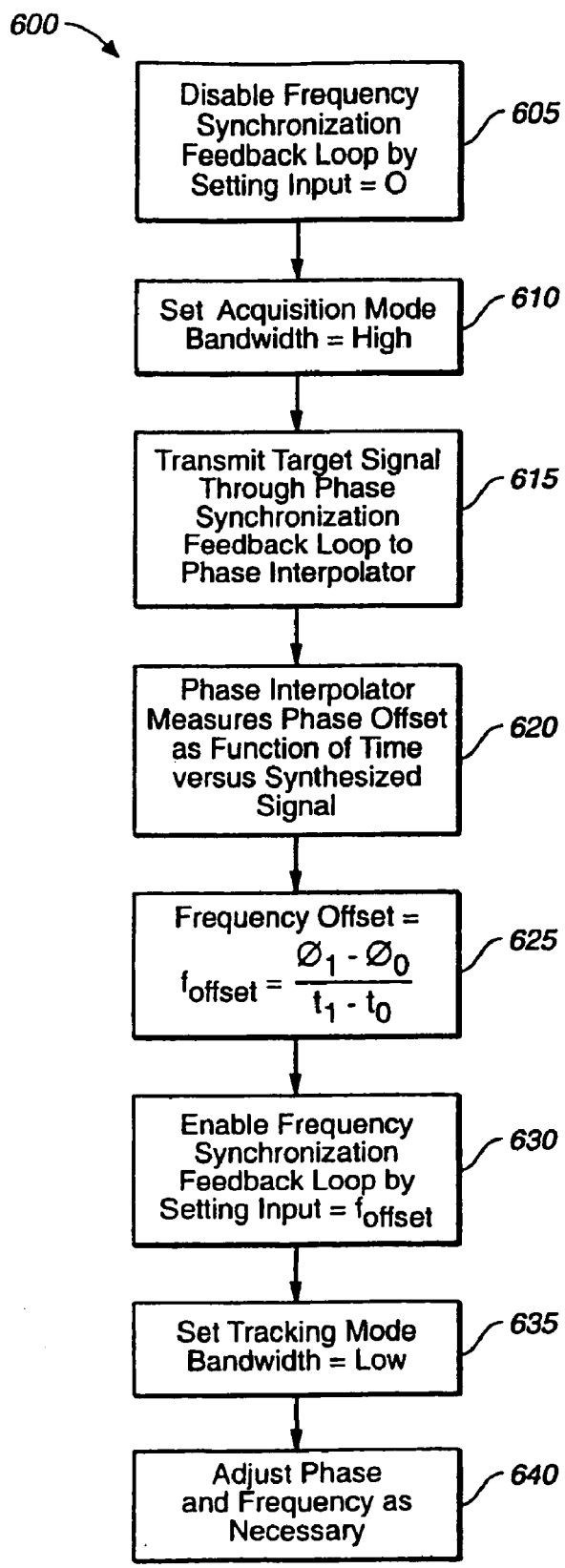
FIG._6

HIGH LATENCY TIMING CIRCUIT

CROSS-REFERENCE TO RELATED APPLICATIONS

This application is a Continuation of U.S. patent application Ser. No. 11/349,565, filed on Feb. 8, 2006 now abandoned, which is a Continuation of Ser. No. 10/831,100 filed on Apr. 26, 2004 now U.S. Pat. No. 7,049,896, which is a continuation of U.S. application Ser. No. 09/725,818, filed on Nov. 30, 2000 now U.S. Pat. No. 6,732,286, the entire contents of which are incorporated herein by reference.

FIELD OF THE INVENTION

The present invention relates to a timing circuit for synchronization of phase and frequency, and particularly to such a circuit having a highly pipelined structure, thereby optimizing the circuit for use in a high-speed read channel while inducing high latency.

DESCRIPTION OF THE RELATED ART

A clock and data recovery system, which may be referred to as a channel, invariably requires a timing recovery feedback loop for clock synchronization. Historically, this need has been fulfilled through the use of a phase-locked loop timing circuit. Phase-locked loop timing circuits typically include a frequency integration feedback loop and a phase integration feedback loop. They operate by first ascertaining the timing frequency and timing phase of the target signal, "locking" onto that frequency and phase, and then tracking deviations to both phase and frequency. The process of locking onto the timing frequency and timing phase is generally referred to as the acquisition mode, and the process of tracking deviations is generally referred to as the tracking mode. Phase-locked loop timing circuits are very well known in the literature and are the subject of many patents. For example, see U.S. Pat. Nos. 5,703,539; 5,727,038; 5,745,011; 5,754,607; 5,761,258; 5,793,824; 5,874,863; 5,889,829; 5,986,513; 5,987,085; 6,028,727; 6,066,988; and 6,084,480, the contents of each of which are incorporated herein by reference.

Typically, a frequency integration feedback loop includes a resistor and a capacitor connected in series, with the capacitor also connected to ground; and a phase integration feedback loop includes a voltage-controlled oscillator. The target signal, generally regarded as being an "error" signal because its phase and frequency require adjustment, is provided as input to the frequency integration feedback loop, and the output of that loop is provided as input to the phase integration feedback loop. Hence, the two loops generally operate jointly. However, the joint use of the two feedback loops reduces the stability of the overall circuit, as compared to the stability of each individual feedback loop. The stability of the overall circuit is inversely related to the speed at which the circuit is operated. In other words, if the circuit is operated at a sufficiently low speed, the circuit remains stable, but as the operation speed increases, the circuit tends to become unstable.

If a channel is to operated at a high speed, the feedback loop must be structured in a highly "pipelined" manner; i.e., more feedback elements must be present in the loop. This causes the loop to have a high latency, or time delay, associated with it. A high latency generally causes degraded performance of the timing loop, which in turn requires that the loop bandwidth be reduced in order to maintain loop stability. However, the timing acquisition must be accomplished in as short a time as possible, in order to maintain the speed of the channel and thereby not adversely impact overall system performance. Thus, a dilemma for implementation of high speed channels is presented.

SUMMARY OF THE INVENTION

The present invention is intended to overcome the drawbacks noted above and provides a high speed timing recovery system with reduced latency.

In one aspect, the invention provides a digital phase locked loop (DPLL) circuit. The DPLL circuit includes a digital filter loop including a register, a digital voltage-controlled oscillator (VCO) responsive to the digital filter loop, and a phase shift measurement circuit responsive to the digital VCO. The register selectively receives an output of the phase shift measurement circuit for frequency offset correction. The DPLL circuit may be operable in an acquisition mode at a high bandwidth rate and in a tracking mode at a low bandwidth rate. When the DPLL circuit is operating in the acquisition mode at a high bandwidth rate, an input to the register may be set equal to zero to maintain DPLL circuit stability. The DPLL circuit may also include a phase interpolator and a synthesizer. The synthesizer may be used to generate a control signal for use by the phase interpolator.

In another aspect, the invention provides a phase locked loop circuit, including a digital filter loop for timing recovery. The circuit includes a phase synchronization feedback loop, a frequency synchronization feedback loop, and a phase shift measurement circuit. The phase shift measurement circuit includes a shift register. When an input to the frequency synchronization feedback loop is set to zero, the phase synchronization feedback loop is operated at a high bandwidth rate to synchronize phase and to compute a value of frequency offset using the shift register. Once the frequency offset has been computed, the input to the frequency synchronization feedback loop is set to the computed value of frequency offset, and the frequency synchronization feedback loop and the phase synchronization feedback loop are jointly operated at a low bandwidth rate to synchronize frequency and to track further deviations of phase or frequency. The use of a low bandwidth rate ensures circuit stability.

The phase locked loop circuit may also include a phase interpolator and a synthesizer. The synthesizer may generate a control signal for use by the phase interpolator. The phase interpolator may then receive an output signal of the voltage-controlled oscillator and the generated control signal.

In yet another aspect of the invention, a digital loop filter for use as part of a phase locked loop includes a first integrator for frequency synchronization and a second integrator for phase synchronization. During a first synchronization period, the filter disables the first integrator and uses the second integrator to synchronize phase and calculate a frequency offset value. During a second synchronization period, the filter enables the first integrator and uses the calculated frequency offset value as an input to the first integrator to synchronize frequency. The filter may also include a phase shift measurement circuit for calculating the frequency offset value using a residual phase error that remains after phase is synchronized. The phase shift measurement circuit calculates the frequency offset value by measuring phase twice, subtracting the first measured value of phase from the second measured value of phase, and dividing the resultant difference by an elapsed time between the two measurements.

In still another aspect, a digital data acquisition loop is used with a phase shift measurement circuit. The loop includes a phase timing circuit having an overflow output, including a control signal. The control signal is provided to the phase shift measurement circuit, which outputs a frequency offset corresponding to the overflow output. The loop also includes a frequency timing circuit, which receives the frequency offset from the phase shift measurement circuit and adjusts the frequency timing of an input data stream based on the received frequency offset. The loop may also initially disable the frequency timing circuit during an acquisition period corresponding to the outputting of the frequency offset, and subsequently enable the frequency timing circuit during a tracking period that follows the outputting of the frequency offset. The loop may operate at a high speed during the acquisition period to ensure high performance, and at a low speed during the tracking period to ensure loop stability.

In a further aspect of the invention, a read channel for a hard disk drive includes a digital phase locked loop (DPLL) circuit. The DPLL circuit includes a digital filter loop comprising a register, a digital voltage-controlled oscillator (VCO) responsive to the digital filter loop, and a phase shift measurement circuit responsive to the digital VCO. The register selectively receives an output of the phase shift measurement circuit for frequency offset correction. The DPLL circuit may be operable in an acquisition mode at a high bandwidth rate and in a tracking mode at a low bandwidth rate, When the DPLL circuit is operating in the acquisition mode at a high bandwidth rate, an input to the register may be set equal to zero to maintain DPLL circuit stability. The DPLL circuit may also include a phase interpolator and a synthesizer. The synthesizer may be used to generate a control signal for use by the phase interpolator.

In yet another aspect of the invention, a read channel for a hard disk drive has a digital filter and includes a first integrator for frequency synchronization, a second integrator for phase synchronization, and a phase shift measurement circuit. During a first synchronization period, the filter disables the first integrator, uses the second integrator to synchronize phase and output a residual phase error to the phase shift measurement circuit, and uses the phase shift measurement circuit to calculate a frequency offset value. During a second synchronization period, the filter enables the first integrator and uses the calculated frequency offset value as an input to the first integrator to synchronize frequency.

In still another aspect of the invention, an integrated circuit, including a digital filter loop for timing recovery, includes a phase shift measurement circuit, a phase synchronization feedback loop, and a frequency synchronization feedback loop, The phase shift measurement circuit includes a shift register. When an input to the frequency synchronization feedback loop is set to zero, the phase synchronization feedback loop runs at a high bandwidth rate to synchronize phase and to compute a value of frequency offset using the shift register. The input to the frequency synchronization feedback loop is then set equal to the computed value of frequency offset. The frequency synchronization feedback loop and the phase synchronization feedback loop then are jointly run at a low bandwidth rate to synchronize frequency and to track further deviations of phase or frequency.

In another aspect of the invention, a phase locked loop circuit includes a timing frequency integrator portion, which includes a first multiplier component, a first adder component, a multiplexer, and a first delay component connected in series. The first delay component provides an output as feedback to the first adder component. The circuit also includes a timing phase integrator portion, which includes a second multiplier component, a second adder component, a third adder component, and a second delay component connected in series. The second delay component provides an output as feedback to the third adder component. The circuit also includes a phase shift measurement portion which provides an output to the multiplexer. The circuit also includes a phase interpolator and a signal generator. The timing frequency integrator portion and the timing phase integrator portion are connected in series. The phase shift measurement portion and the phase interpolator are responsive to the timing phase integrator portion. The signal generator generates a control signal and provides the control signal as an input to the phase interpolator. When an input to the timing frequency integrator portion is set to zero, the timing phase integrator portion runs at a high bandwidth rate to synchronize phase and to compute a value of frequency offset using the phase shift measurement portion. When the input to the timing frequency integrator portion is set equal to the computed value of frequency offset, the timing frequency integrator portion and the timing phase integrator portion are jointly run at a low bandwidth rate to synchronize frequency and to track further deviations of phase or frequency. The voltage-controlled oscillator may also include a shift register.

In a further aspect of the invention, an apparatus for synchronizing phase and frequency in a high-speed circuit includes means for synchronizing phase using a first type of feedback loop during a first synchronization period, means for calculating a value of frequency offset using the first type of feedback loop during the first synchronization period, and means for synchronizing frequency using the calculated value of frequency offset as an input to a second type of feedback loop during a second synchronization stage. The first type of feedback loop adjusts phase but not frequency. The second type of feedback loop adjusts both phase and frequency.

In yet another aspect of the invention, a method of synchronizing phase and frequency in a high-speed circuit includes the steps of synchronizing phase using a first type of feedback loop during a first synchronization period; calculating a value of frequency offset using the first type of feedback loop during the first synchronization period; and synchronizing frequency using the calculated value of frequency offset as an input to a second type of feedback loop during a second synchronization stage. The first type of feedback loop adjusts phase but not frequency. The second type of feedback loop adjusts both phase and frequency.

In another aspect of the invention, a method of controlling frequency and phase in a high-speed control circuit includes the steps of executing an acquisition mode in which phase deviation is corrected and frequency deviation is computed, and executing a tracking mode in which frequency deviation is corrected. The acquisition mode operates at a high bandwidth value to cause the high-speed control circuit to operate at a high speed related to the high bandwidth value. The tracking mode operates at a low bandwidth value to maintain stability of the circuit.

In a further aspect of the invention, a method of increasing speed in a timing recovery circuit is manifested. The circuit includes a frequency synchronization portion and a phase synchronization portion, and the circuit has a high latency. The method of increasing speed in the circuit includes the steps of substantially disabling the frequency synchronization portion temporarily by providing an input value of substantially zero; selecting a high value of bandwidth to be used by the phase synchronization portion while the frequency synchronization portion is substantially disabled; synchronizing phase at a speed related to the selected bandwidth value; using a residual phase error, resulting from the fact that the frequency has not been synchronized, to calculate a value of frequency offset; selecting a low value of bandwidth to be used by the circuit while the frequency synchronization portion is not disabled; and enabling the frequency synchronization portion by providing an input value equal to the calculated frequency offset value.

In yet another aspect of the invention, a method of phase and frequency adjusting an input digital data stream includes an acquisition period, during which the steps of integrating a phase of the input data stream until an overflow causes a control signal to be output and determining a frequency offset from the control signal are executed. The method further includes a data acquisition period, during which the step of integrating a frequency of the input data stream using the determined frequency offset is executed.

BRIEF DESCRIPTION OF THE DRAWINGS

FIG. 1 is a graph showing the time and bandwidth attributes of an acquisition mode and a tracking mode that occur during a timing recovery process.

FIG. 2 is a circuit diagram of a phase-locked loop circuit for implementing the timing recovery process.

FIG. 3 is an illustration of a shift register.

FIG. 4 is a graph showing an output of a phase integration portion of the circuit of FIG. 2, and a mathematical formula for using the phase integration output to compute a frequency offset value.

FIG. 5 is a signal flow diagram of the timing recovery process.

FIG. 6 is a flowchart for illustrating the steps of the timing recovery process.

DETAILED DESCRIPTION OF THE INVENTION

The present invention addresses the need for more effective timing recovery circuits to be used in high-speed channels, such as a read channel of a hard disk drive. In the development of the present invention, the inventor has recognized that a timing circuit (e.g., a phase-locked loop circuit) can be viewed as being either a type I timing circuit, in which only phase correction occurs, or a type II timing circuit, in which both phase correction and frequency correction occur. In a type I circuit, because only phase correction occurs, the frequency integration feedback loop need not be operational. Thus, in a type I circuit, a higher loop bandwidth and correspondingly higher speed are possible, as compared to a type II circuit having the same latency, because a type I circuit is inherently more stable than a type II circuit.

A type II timing circuit can be used as a type I timing circuit by disabling the frequency integration feedback loop. This may be achieved by setting the input to the frequency integration feedback loop equal to zero. In this manner, a high bandwidth type I circuit can operate to "lock" onto the correct timing phase. However, because no frequency correction occurs, there is still a significant timing frequency error. Such an uncorrected timing frequency error will eventually cause the timing circuit to fail, after the channel switches from acquisition mode to tracking mode.

The solution proposed in this invention is to use the type I circuit while in the acquisition mode, and simultaneously calculate an estimated value of frequency offset. By calculating the estimated frequency offset while in the acquisition mode, the timing frequency can be adjusted prior to exiting acquisition mode and entering tracking mode. Referring to FIG. 1, the procedure is as follows: First, during the acquisition mode period 105, operate the type I circuit at a high bandwidth value 110 to lock onto the timing phase and calculate the frequency offset. Then, enable the frequency integration feedback loop, thereby converting the circuit into a type II circuit, by resetting its input so that the input is equal to the calculated frequency offset value. Finally, reduce the bandwidth to a low value 115 so that the type II circuit can operate in tracking mode 120 while maintaining stability of the timing circuit.

The frequency offset is calculated by the type I circuit by taking two phase measurements at the output of the phase integration feedback loop, subtracting the first value from the second, and dividing the difference by the elapsed time.

Referring to FIG. 2, a preferred implementation of such a timing circuit is the use of a digital loop filter 200 in a phase-locked loop circuit (DPLL). The digital loop 200 includes two integrators 205, 210. The first integrator 205 is the timing frequency integrator, and the second integrator 210 is the timing phase integrator. The target signal $S_T$ 215, i.e., the signal being communicated via the channel and requiring timing recovery, is one input to the frequency integrator 205. The frequency correction gain parameter acts as a second input 220 to the frequency integrator 205 and is denoted by the variable b. A multiplier 225 combines the inputs $S_T$ 215 and b 220 to produce another version of the signal which has the same characteristics as $S_T$ 215, except that its magnitude is controlled by b 220. This result enters a feedback loop via an adder 230. A multiplexer 235 combines in an output of a phase shift measurement circuit 240, which is further described below. A delay element 245 operates on the result of multiplexing the magnitude-controlled signal with the phase shift measurement, and the output of the delay element 245 is fed back to the adder 230. By adding the delayed version of the magnitude-controlled signal with the undelayed version of the magnitude-controlled signal (while taking phase shift into account), an estimate of the frequency offset is made.

The output of the frequency integrator 205 is provided as one input to the phase integrator 210, and the other input represents the signal $S_T$ 215 with its magnitude multiplied using a multiplier 250 by the phase correction gain parameter, denoted by the variable a 255. The phase integrator 210 generally comprises a feedback loop, and may be viewed as being a digital voltage-controlled oscillator (VCO). The two inputs to the digital VCO 210 are added together using an adder 260, and a delay element 265 operates on this sum. The output of the digital VCO 210 is fed back additively via an adder 270 to enable the phase offset and the frequency offset to be estimated. The same output is provided as input to the phase shift measurement circuit 240. Referring also to FIG. 3, the phase shift measurement circuit 240 may be embodied in a digital shift register circuit 300.

Referring to FIGS. 2 and 4, with a frequency offset being outputted by the frequency integrator 205, the output of the phase integrator 210 will ramp linearly as a function of time, and wrap around as it overflows. The graph 405 in FIG. 4 depicts this output. The linear ramping at the output of the phase integrator provides the control signal to the phase shift measurement circuit 240 which effectively creates the frequency offset, and provides an output to a phase interpolator 275 that receives a control signal from a signal generator 280. If the frequency integrator 205 is enabled by setting the input gain b 220 to some nonzero value, the DPLL 200 is running in type II mode. However, if the phase correction gain a 255 is sufficiently large, as in the typical case during the acquisition mode period 105, the loop 200 can still function properly while the frequency integrator 205 is disabled. Such a disablement can be achieved by setting the frequency correction gain parameter b 220 equal to zero. This will allow the DPLL 200 to run in type I mode. A small residual timing phase error will occur in the DPLL system to provide the driving force to cause the phase integrator 210 to ramp. The ramp rate at the output of the phase integrator 210 is a direct measure of the frequency error. So, by measuring the phase integrator output value $\phi_0$ 410 at a certain time $t_0$ 415 during the acquisition mode period 105 and measuring the phase integrator output $\phi_1$ 420 again at another time $t_1$ 425, the frequency error $f_{offset}$ 430 can be calculated according to the equation 435: $f_{offset}=(\phi_1-\phi_0)/(t_1-t_0)$.

Once the frequency offset value 430 is calculated, the frequency integrator 205 can be enabled by setting the input frequency correction gain parameter b 220 to that value. Thus, higher stability for the timing loop 200 is achieved during acquisition 105, while effectively providing frequency correction capability that is normally provided by a type II timing circuit.

Referring to FIG. 3, one common embodiment for the phase shift measurement circuit 240 is a digital shift register circuit 300. The digital shift register circuit 300 includes an eight-bit register 305 and an adder 310. The output of the phase integrator 210 is fed into the register 305 in the form of an eight-bit word, and this output is also fed directly to the adder 310. The register 305 may shift the bits rotationally as a function of time, and the output of this rotational operation is fed to the adder 310. By adding the eight-bit word to a rotated version of itself the phase shift measurement operation is accomplished.

Referring to FIG. 5, a signal flow for the timing recovery process is shown. The signal flows occurring within the digital loop filter 200 are shown within the dotted line. Referring also to FIG. 4, the phase integrator 210 outputs an overflow signal 510 that has a ramp profile as depicted in graph 405. The overflow signal 510 flows into the phase shift measurement circuit 240, which outputs the frequency offset 430. The frequency offset 430 then flows back into the frequency integrator 205, which adjusts the frequency 515, thereby enabling the DPLL 200 to enter the tracking mode 120.

Referring to FIG. 6, a flow chart for the entire timing recovery process 600 is shown. The first step 605 is to disable the frequency integrator 205 by zeroing the frequency correction gain parameter 220. The process 600 can be performed without actually setting the frequency correction gain parameter 220 to zero, although zeroing the parameter 220 is preferred; the important objective is that the process must remain stable while operating at a high value 110 of bandwidth for the acquisition mode 105. The next step 610 is to set the bandwidth for the acquisition mode 105 to a high value 110, thereby allowing for the rapid acquisition which is necessary to the operation of the high-speed channel. The next step 615 is to transmit the target signal $S_T$ 215 through the DPLL 200 to the phase shift measurement circuit 240. The disablement of the frequency integrator 205 allows the phase integrator 210 to output the control signal 510, whose profile is shown in graph 405. The next step 620 is for the phase shift measurement circuit 240 to measure the phase offset. The phase offset is then used in step 625 to compute the frequency offset 430 according to equation 435. Then, in step 630, the frequency offset 430 is equated to the frequency correction gain parameter 220, thereby enabling the frequency integrator 205. This allows the frequency adjustment 515 to occur, thereby allowing the DPLL 200 to enter the tracking mode 120. The bandwidth for tracking mode is set to a low value 115 in step 635. Finally, in step 640, the DPLL 200 makes adjustments for further phase and frequency deviations while in the tracking mode 120.

Referring again to FIG. 1, the high and low bandwidth values 110 and 115 are a function of the speed of the channel and the actual latency of the DPLL 200. The ratio between the high bandwidth value 110 and the low bandwidth value 115 is application dependent. A typical ratio may be 2:1 or 3:1, although some systems may have ratios as high as 4:1 or 5:1. Latency is typically measured in clock cycles, and a high latency circuit such as the DPLL 200 may have a latency as high as 10 to 15.

One application for which the present invention may be very useful is a read channel for a hard disk drive. Every time there is an access to a sector of data within the disk drive, the signal must be reacquired. Because the capacities of disk drives are increasing, the speed and accuracy of the read channel is impacted significantly by timing recovery. Another pertinent application is a data communication system, such as a 10-Gigabyte Ethernet. Acquisition of a signal occurs each time a network device is activated or connected to the network.

Various equivalent embodiments of the present invention may be realized. For example, the described embodiments may be embodied in special purpose integrated circuits (ICs), digital signal processors (DSPs), or software recorded on a computer-readable storage medium. As another example, any type of circuitry that performs a timing recovery function for a signal by adjusting phase and frequency can take advantage of the methodology described herein; the circuit need not necessarily be a phase-locked loop. As another example, the phase shift measurement circuit need not necessarily be a digital shift register circuit; analog circuitry and analog signals can make effective use of the invention. As yet another example, the frequency correction gain parameter may be set to a nonzero value such that the circuit remains stable while operating at a high bandwidth in the acquisition mode.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A phase locked loop (PLL) circuit, comprising:
a loop filter that receives a phase error, a frequency gain parameter and a phase gain parameter and that includes an output and a frequency integrator that receives a frequency offset;

a phase integrator circuit that communicates with the output of the loop filter and that generates a phase control signal; and a phase shift measurement circuit that generates the frequency offset signal based on the phase control signal, wherein the PLL circuit selectively operates in one of an acquisition mode and a tracking mode based on values of the frequency gain parameter and the phase gain parameter.

2. The PLL circuit of claim 1 further comprising a phase interpolator circuit that generates a recovered clock based on the phase control signal and a local clock.

3. The PLL circuit of claim 1,
wherein when the frequency gain parameter and the phase gain parameter have first and second values, respectively, the PLL circuit operates in the acquisition mode,
wherein when the frequency gain parameter and the phase gain parameter have third and fourth values, respectively, the PLL circuit operates in a tracking mode, and
wherein the first value is less than or equal to the third value and the second value is greater than or equal to the fourth value.

4. The PLL circuit of claim 1 further comprising a synthesizer circuit that provides the local clock to the phase interpolator circuit.

5. The PLL circuit of claim 1 wherein the phase shift measurement circuit determines the frequency offset by generating a phase difference between first and second phase control signals and dividing the phase difference by a period between the first and second phase control signals.

6. The PLL circuit of claim 1 wherein the PLL circuit has a first bandwidth in the tracking mode and a second bandwidth in the acquisition mode, wherein the second bandwidth is lower than the first bandwidth.

7. The PLL circuit of claim 1 wherein the phase error is based on a received signal and a local clock.

8. The PLL circuit of claim 1 wherein the frequency integrator includes:
a delay element;
a summer that receives an output of the delay element and a product of the phase gain parameter and the phase error; and
a multiplexer that selectively connects one of an output of the summer and the frequency offset to the delay element.

9. The PLL circuit of claim 7 wherein the loop filter comprises a summer that receives an output of the delay element and a product of the phase gain parameter and the phase error.

10. A phase locked loop (PLL) circuit, comprising:
loop filter means for receiving a phase error, a frequency gain parameter and a phase gain parameter and that includes an output and frequency integrating means for receiving a frequency offset;
phase integrator means for communicating with the output of the loop filter means and for generating a phase control signal; and
phase shift measurement means for generating the frequency offset signal based on the phase control signal,
wherein the PLL circuit selectively operates in one of an acquisition mode and a tracking mode based on values of the frequency gain parameter and the phase gain parameter.

11. The PLL circuit of claim 9 further comprising phase interpolator means for generating a recovered clock based on the phase control signal and a local clock.

12. The PLL circuit of claim 9,
wherein when the frequency gain parameter and the phase gain parameter have first and second values, respectively, the PLL circuit operates in the acquisition mode,
wherein when the frequency gain parameter and the phase gain parameter have third and fourth values, respectively, the PLL circuit operates in a tracking mode, and
wherein the first value is less than or equal to the third value and the second value is greater than or equal to the fourth value.

13. The PLL circuit of claim 10 further comprising synthesizer means for providing the local clock to the phase interpolator means.

14. The PLL circuit of claim 9 wherein the phase shift measurement means determines the frequency offset by generating a phase difference between first and second phase control signals and dividing the phase difference by a period between the first and second phase control signals.

15. The PLL circuit of claim 9 wherein the PLL circuit has a first bandwidth in the tracking mode and a second bandwidth in the acquisition mode, wherein the second bandwidth is lower than the first bandwidth.

16. The PLL circuit of claim 9 wherein the phase error is based on a received signal and a local clock.

17. The PLL circuit of claim 9 wherein the frequency integrating means includes:
delay means for delaying;
summing means for summing an output of the delay element and a product of the phase gain parameter and the phase error; and
multiplexing means for selectively connecting one of an output of the summing means and the frequency offset to the delay means.

18. The PLL circuit of claim 17 wherein the loop filter means comprises summing for receiving an output of the delay means and a product of a phase gain parameter and the phase error.

19. A method for operating a phase locked loop (PLL) circuit, comprising:
providing a loop filter that receives a phase error, a frequency gain parameter and a phase gain parameter and that includes an output and a frequency integrator that receives a frequency offset;
providing a phase integrator circuit that communicates with the output of the loop filter and that generates a phase control signal;
generating the frequency offset based on the phase control signal; and
selectively operating in one of an acquisition mode and a tracking mode by adjusting values of the frequency gain parameter and the phase gain parameter.

20. The method of claim 19 further comprising generating a recovered clock based on the phase control signal and a local clock.

21. The method of claim 19,
wherein when the frequency gain parameter and the phase gain parameter have first and second values, respectively, the PLL circuit operates in the acquisition mode,
wherein when the frequency gain parameter and the phase gain parameter have third and fourth values, respectively, the PLL circuit operates in a tracking mode, and
wherein the first value is less than or equal to the third value and the second value is greater than or equal to the fourth value.

22. The method of claim 19 further comprising generating the local clock.

23. The method of claim 18 further comprising determining the frequency offset by:
- generating a phase difference between first and second phase control signals; and
- dividing the phase difference by a period between the first and second phase control signals.

24. The method of claim 18 wherein the PLL circuit has a first bandwidth in the tracking mode and a second bandwidth in the acquisition mode, wherein the second bandwidth is lower than the first bandwidth.

25. The method of claim 18 further comprising basing the phase error on a received signal and a local clock.

* * * * *

UNITED STATES PATENT AND TRADEMARK OFFICE
CERTIFICATE OF CORRECTION

| | | |
|---|---|---|
| PATENT NO. | : 7,304,545 B1 | Page 1 of 1 |
| APPLICATION NO. | : 11/507916 | |
| DATED | : December 4, 2007 | |
| INVENTOR(S) | : Pantas Sutardja | |

It is certified that error appears in the above-identified patent and that said Letters Patent is hereby corrected as shown below:

Column 1, Line 62    Delete "to" after "is"

Signed and Sealed this

Thirteenth Day of May, 2008

JON W. DUDAS
*Director of the United States Patent and Trademark Office*